United States Patent [19]

Zambrano et al.

[11] Patent Number: 5,119,161

[45] Date of Patent: Jun. 2, 1992

[54] SEMICONDUCTOR DEVICE COMPRISING A CONTROL CIRCUIT AND A POWER STAGE WITH A VERTICAL CURRENT FLOW, INTEGRATED IN MONOLITHIC FORM ON A SINGLE CHIP

[75] Inventors: Raffaele Zambrano, Mercato San Severino; Salvatore Musumeci, Riposto CT; Salvatore Raciti, Belpasso CT, all of Italy

[73] Assignee: SGS-Thomson Microelectronics S.r.L., Brianza, Italy

[21] Appl. No.: 537,940

[22] Filed: Jun. 14, 1990

[30] Foreign Application Priority Data

Jun. 16, 1989 [IT] Italy ................... 6610 A/89

[51] Int. Cl.⁵ ............... H01C 27/02; H01C 29/10; H01C 29/80; H01L 29/80
[52] U.S. Cl. ..................... 357/43; 357/41; 357/44; 357/47; 357/23.4; 357/22
[58] Field of Search .......... 357/43, 44, 47, 22 E, 357/23.4

[56] References Cited

U.S. PATENT DOCUMENTS 4,783,423 11/1988 Yamauchi .................. 357/43

FOREIGN PATENT DOCUMENTS

0117867A1 of 0000 European Pat. Off. .
0283135A1 of 0000 European Pat. Off. .
0307032A2 of 0000 European Pat. Off. .
0322040 6/1989 European Pat. Off. ........... 357/43
63-204640 8/1988 Japan .
1592856 of 0000 United Kingdom .

OTHER PUBLICATIONS

"The Turnoff Transient of the Bipolar-Mode Field-Effect Transistor", Vitale et al., IEEE Transactions on Electron Devices, Oct. 1988, New York, pp. 1676–1682.
"Isolation Techniques in Power IC's with Vertical Current Flow"; R. Zambrano et al., Sep. 14, 1987; SGS Microelectrica S.P.A., pp. 653–656.

Primary Examiner—Rolf Hille
Assistant Examiner—Wael Fahmy
Attorney, Agent, or Firm—Wenderoth, Lind & Ponack

[57] ABSTRACT

The problems normally linked to the creation of a power stage using BJT transistors are overcome realizing the power stage with BMFET transistors.

2 Claims, 4 Drawing Sheets

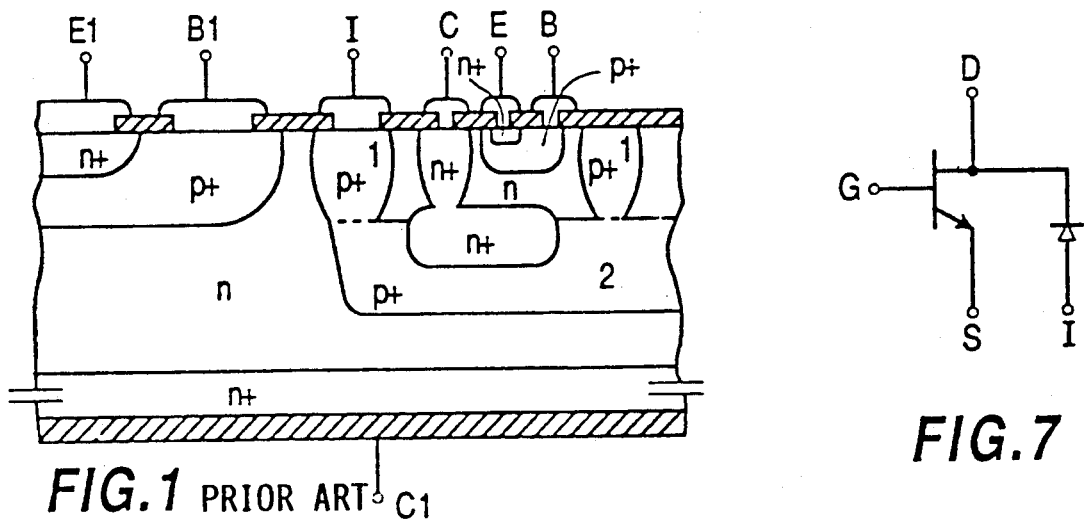
FIG.1 PRIOR ART
FIG.7
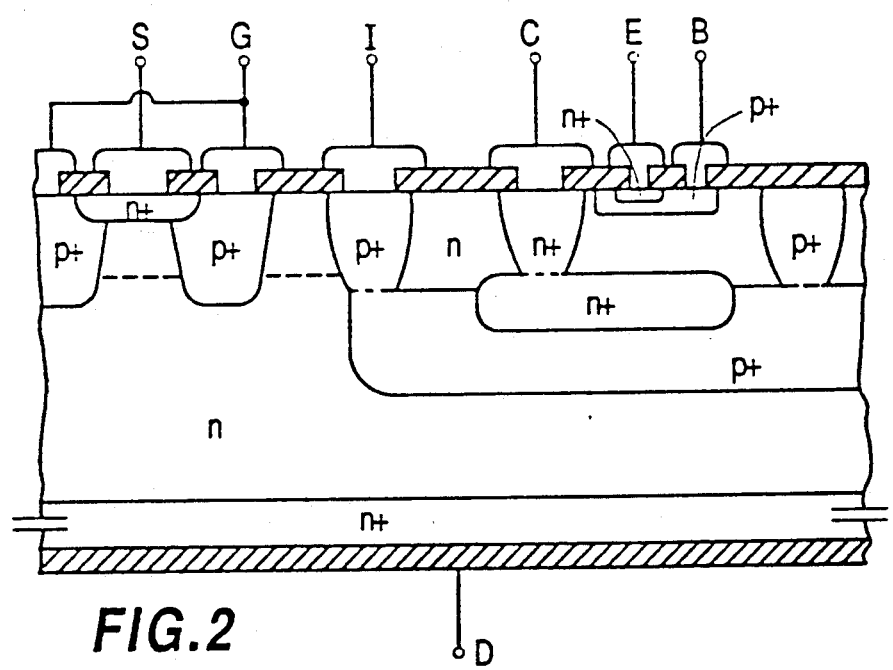
FIG.2
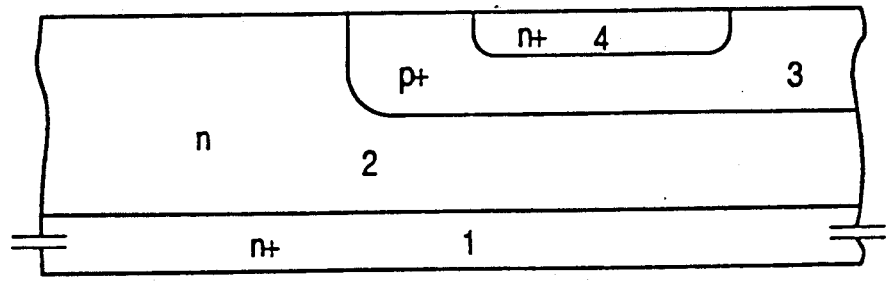
FIG.3

SEMICONDUCTOR DEVICE COMPRISING A CONTROL CIRCUIT AND A POWER STAGE WITH A VERTICAL CURRENT FLOW, INTEGRATED IN MONOLITHIC FORM ON A SINGLE CHIP

BACKGROUND OF THE INVENTION

The present invention relates to a semiconductor device comprising a control circuit and a power stage with a vertical current flow, integrated in monolithic form in a single chip.

The association on the same chip of a power stage realized with bipolar transistors (BJT) and the related control circuit, creates a very compact, efficient device, which has the following advantages over separate components:

- the reliability and the efficiency of the device increases, as it is possible to insert a series of dedicated controls (e.g. "thermal shutdown", to switch-off the power stage when a certain maximum temperature is reached, "SOA" protection against direct secondary breakdowns, etc.), which, inasmuch as they are included on the same chip, are much more efficient than an external control;
- the cost of the system using a similar device is lower, as a single package is used instead of two (or more packages); this not only reduces the space and the weight of the system, but also increases overall reliability.

On the other hand the use of BJT-type power stages makes it more difficult to solve other problems, such as, basically, the low switching speed, the maximum current density, the extension of the Reverse Bias Safe Operating Area (RBSOA). It is however a known fact that the use of power stages of the MOS type is only advisable for devices which can operate at low voltages, due to the problems connected to excessive series drain resistance (Ron).

SUMMARY OF THE INVENTION

The object of the invention is to develop an integrated monolithic semiconductor device which, while maintaining the advantages indicated above makes it possible to overcome the problems connected with the use of BJT and MOS power stages.

This object is effected by forming the power stage with BMFET transistors (Bipolar Mode Field Effect Transistors).

This choice makes it possible to maximize the current handling, the ruggedness and the dynamic performances of the power stage. It also offers the following additional advantages:

- a higher switching speed, and, as a result, lower power losses;
- a higher current density, and therefore reduced area of the device;
- a greater extension of the RBSOA area, and, as a result, reduced complexity of the driving circuit, as it is no longer necessary to protect the power stage while switching off inductive loads;
- an easier design of the power stage, on account of the modular structure of the BMFET transistor (in fact, since the BMFET transistor is made up of a plurality of identical elementary cells, a certain operating current is ensured simply by parallel connecting the required number of elementary cells).

BRIEF DESCRIPTION OF THE DRAWINGS

The features of the present invention may be better understood by the following description and the attached drawings, illustrating an example of the present invention, in which the various figures show:

FIG. 1: a structure of a known device;

FIG. 2: a structure of a similar device according to the present invention;

FIGS. 3, 4, 5, 6: a first example of a manufacturing process of the device in FIG. 2;

FIG. 7: electrical equivalent of the structure in FIG. 6;

DESCRIPTION OF THE PREFERRED EMBODIMENTS

Figure 4:
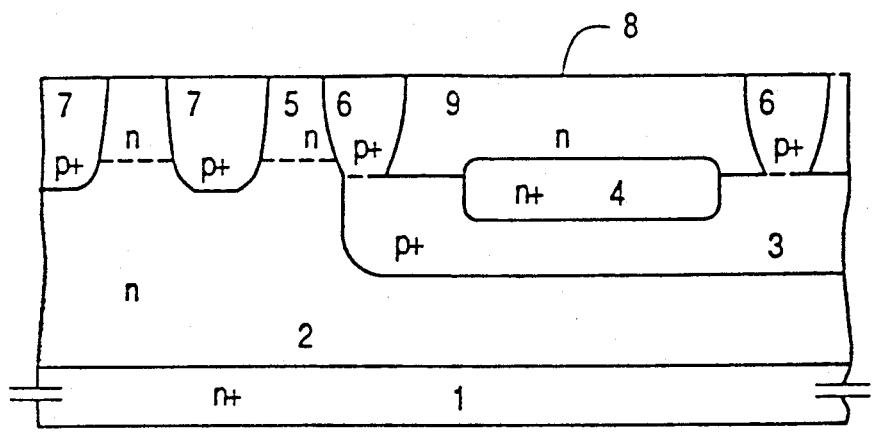

FIG. 1 illustrates the known structure of a semiconductor device comprising a control circuit and a power stage with a vertical current flow, integrated in monolithic form on a single chip. For the sake of simplicity only one NPN transistor of the integrated control circuit (with emitter terminal=E, base terminal=B and collector=C), and one bipolar power transistor (with emitter terminal=E1, base terminal=B1 and collector=C1), have been indicated.

Regions 1 and 2 together constitute the isolation region of the NPN low voltage transistor which, for the correct operation of the device, is connected, via terminal I, to the point of lowest potential of the device itself. FIG. 2 illustrates the structure of a similar device according to the present invention. This structure differs from FIG. 1 in that the BJT power transistor is replaced by a BMFET transistor (with source terminal=S, gate terminal=G and drain terminal=D). The manufacturing process can be described as follows.

An n type epitaxial layer 2 is grown on an n+ type substrate 1 of monocrystalline silicon with a high concentration of impurities (FIG. 3).

Using the usual techniques of oxidation, photomasking, implantation and diffusion, a p+ type region 3 is formed, to constitute the horizontal isolation region of the components of the integrated control circuit and, within it, an n+ type region 4 is formed, destined to serve as buried collector layer of a transistor of the integrated control circuit.

At this point (FIG. 4) a new epitaxial layer is grown, through which an n type region 5 is obtained, extending over the whole area of the chip. Using the well known techniques of oxidation, photomasking, implantation and diffusion, p+ type regions 6 and 7 are formed.

FIG. 4 shows how regions 6 extend from surface 8 to reach region 3 and to enclose an n type region 9, within which the NPN low voltage transistor will later be created, while regions 7 are destined to be used as the gate of the BMFET transistor.

Figure 5:
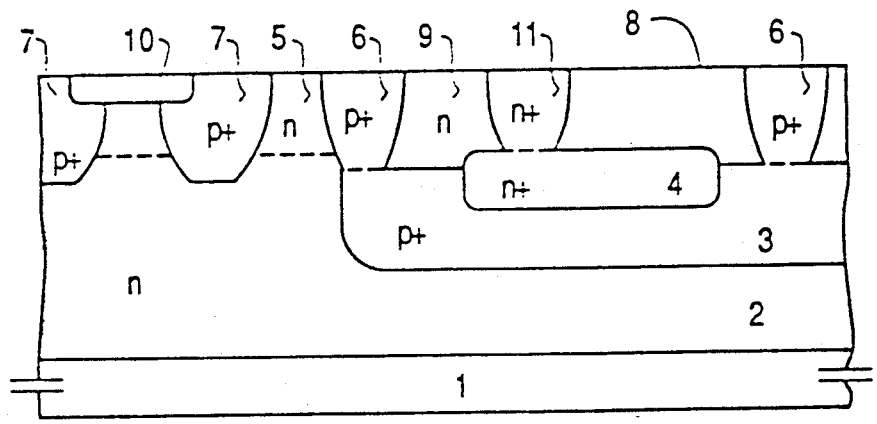

At this point (FIG. 5) regions 10 and 11, of n+ type, are formed, to be used, respectively, as the source of the BMFET transistor and as collector sink, which reduces the series resistance of the collector of the low voltage transistor.

With well known techniques (FIG. 6) the base region 12 and the emitter region 13 of the NPN low voltage transistor are formed, contacts are realized and the various elements of the device are interconnected by a process of metallization and photomasking. All the terminal electrodes of the various components are thus located on the front of the chip, except for the drain of the BMFET transistor which is on the back.

Figure 6:
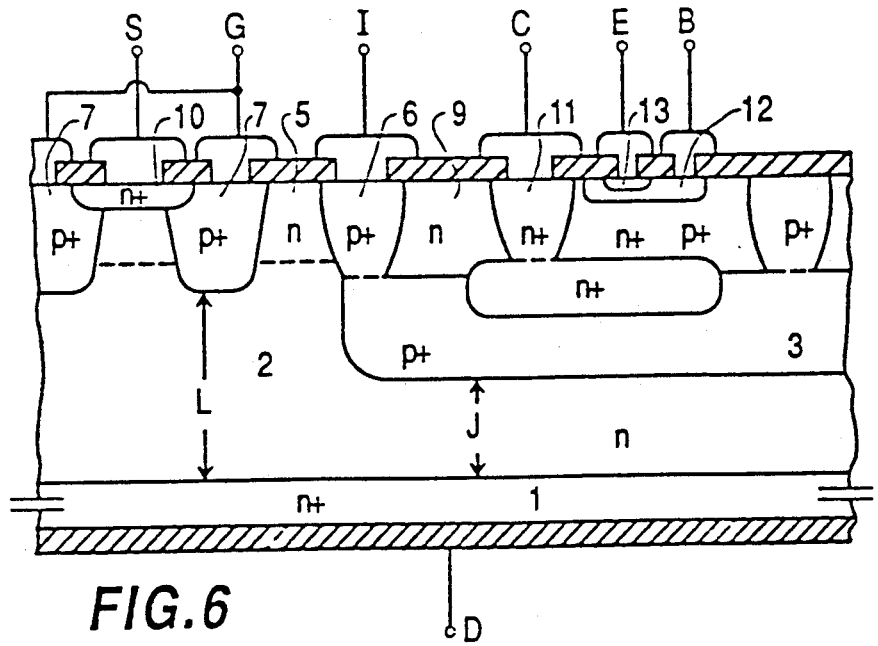
Figure 8:
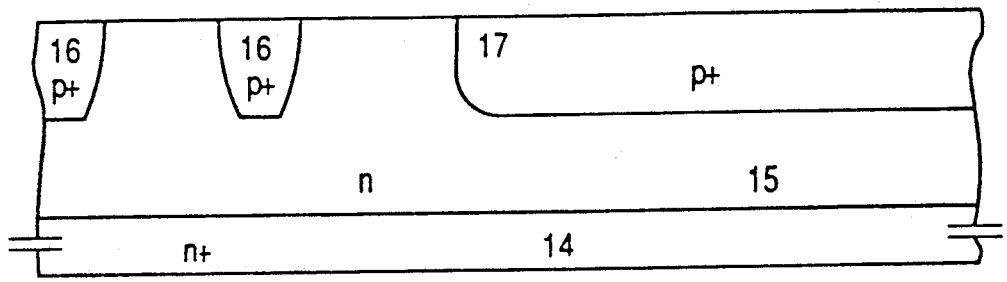
FIGS. 8, 9, 10, 11, 12: second example of a manufacturing process of a device according to the invention.
Figure 9:
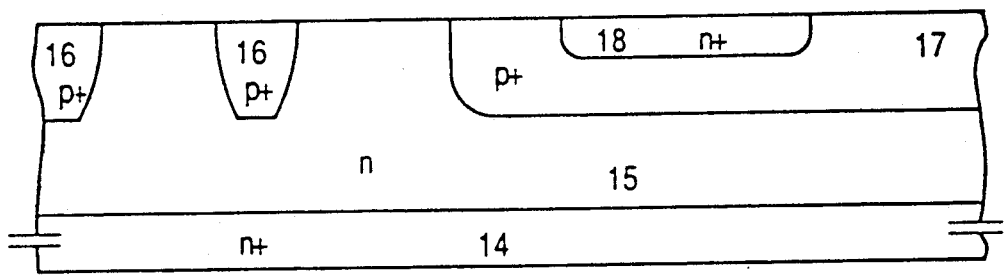
Figure 10:
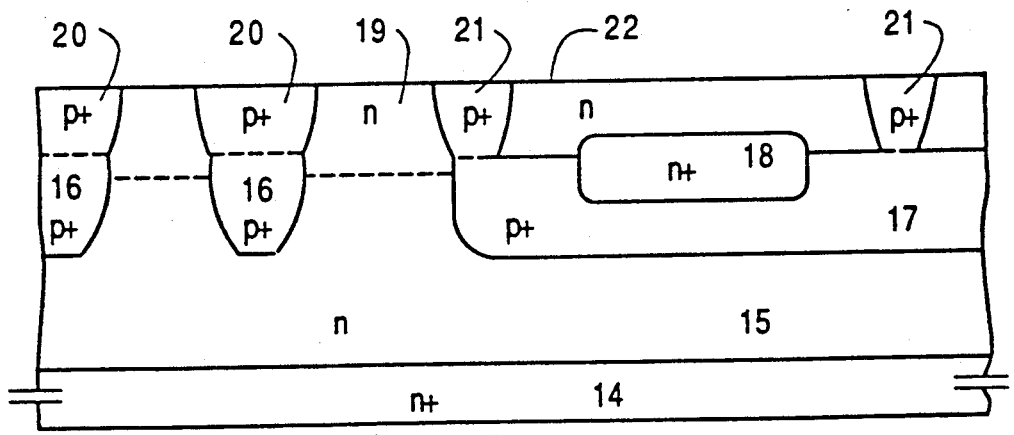
Figure 11:
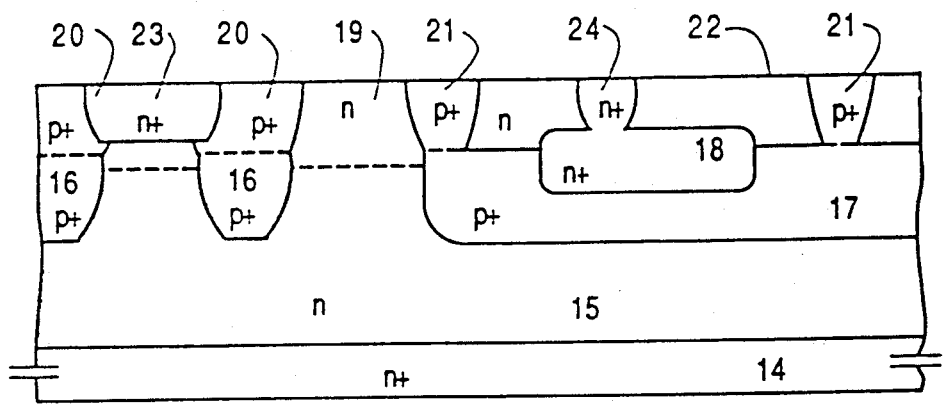

FIG. 7 illustrates the electrical equivalent of the structure of FIG. 6 relating to the BMFET. It shows that the diode, whose anode is the isolation region, and whose cathode is the drain of the BMFET transistor, is reverse biased if terminal I is connected to the point of lowest potential among those present on the circuit; the components of the integrated control circuit are therefore isolated from each other and from the power stage.

In FIG. 6 it is clear that distance J between the lower edge of the isolation region and the substrate is lower than distance L between the lower edge of the gate region of the BMFET transistor and the substrate: as a result the breakdown voltage of the diode mentioned above is lower than the breakdown voltage of the BMFET transistor, and therefore the maximum operating voltage of the monolithic device corresponds to the first of these two breakdown voltages. It is therefore necessary, at the design stage, to establish the thickness J so that it can withstand the maximum required voltage. Since the current gain of the BMFET depends on the drain thickness, or L, according to a law of inverse quadratic proportionality, and since $L > J$, it can be seen that this gain is penalized by the different junction depth of the BMFET gate compared to that of the horizontal isolation region 3.

It is therefore advantageous to devise a process which will make it possible to achieve $L = J$, as this will bring the current handling capability to a maximum, maintaining unchanged the device operating voltage. This equality is made possible by creating the BMFET gate region and the horizontal isolation region before the second epitaxial growth, using the same process of diffusion.

An example of a process suitable to achieve this purpose is illustrated in FIGS. 8, 9, 10, 11 and 12.

This process includes the following stages in sequence:

a first n type epitaxial layer 15 is grown on a substrate 14 of n+ type monocrystalline silicon with a high concentration of impurities;

with the usual techniques of oxidation, photomasking, implantation and diffusion, regions 16 and 17 of p+ type are formed within layer 15, destined to constitute respectively the BMFET gate region and the horizontal isolation region of the integrated control circuit components;

an n+ type region 18 is formed within region 17, in order to provide the buried collector layer of the transistor of the integrated control circuit;

a second epitaxial layer is grown creating an n type region 19, which covers the whole surface of the chip;

using known techniques of oxidation, photomasking and implantation of the second epitaxial layer and successive diffusion, regions 20 and 21 of p+ type are formed; regions 20 are immediately above regions 16 and join them, regions 21 extend from surface 22 up to reach region 17;

two n+ type regions 23 and 24 are formed; region 23, constituting the source of the BMFET, is localised between two adjacent regions 20 inside which it extends, while region 24, constituting the collector sink, is placed above region 18 and joins it;

using well known techniques the base region 25 and the emitter region 26 of the NPN low voltage transistor are made, the contacts are realized and the various elements of the device are interconnected by means of metallization and photomasking process.

Figure 12:
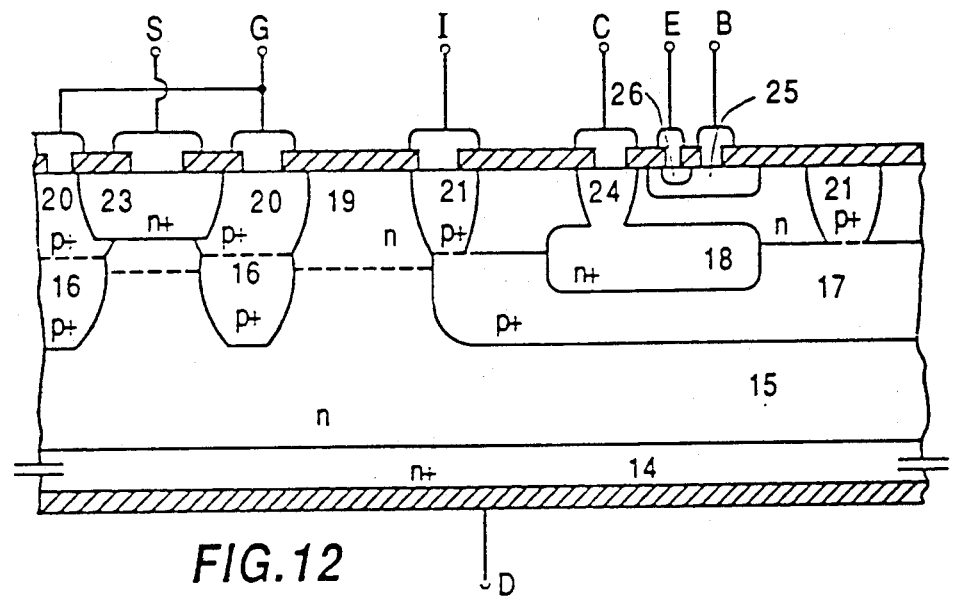

FIG. 12 shows that the gate of the BMFET and the horizontal isolation region have the same junction depth. The embodiment of the process illustrated in FIGS. 8–12 offers two further advantages: the length of the channel (and therefore the blocking gain of the BMFET transistor) is increased, and it is also possible to set the doping concentration the first and second epitaxial layers independently, as the channel extends mainly in the first epitaxial layer, while the region of the epitaxial collector of the transistor of the control circuit is situated inside the second epitaxial layer: the doping levels of these two layers can, as a consequence, also be determined independently of each other.

It is clear that the examples of realization described above can be modified, adapted or integrated, without going outside the scope of the present invention.

Figure 13:
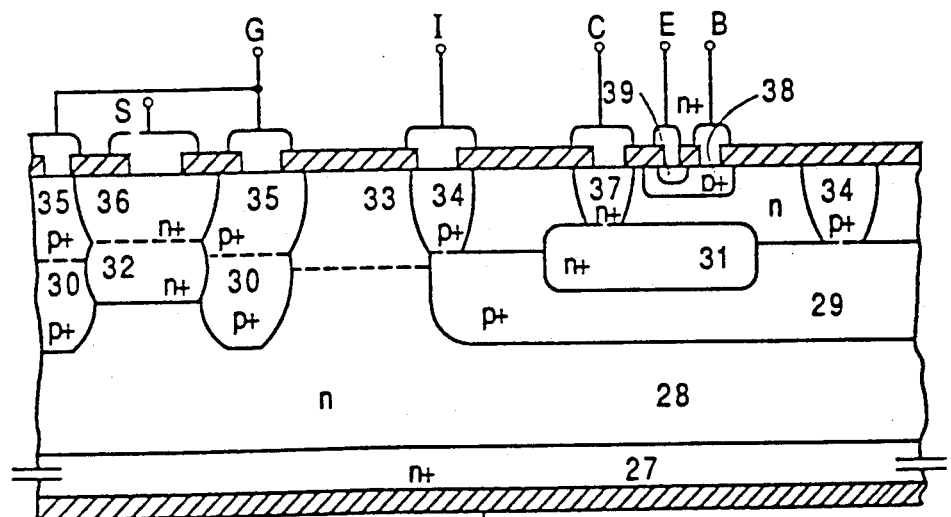
FIG. 13: a final structure of a device obtained with a variation to the process illustrated in FIGS. 8-12.

FIG. 13 illustrates one possible embodiment. It regards the source region of the BMFET which could be made up of two regions 32 and 36 in series, if one wished to place a greater priority on the lower series drain resistance, instead of the blocking gain.

The relative manufacturing process foresees the following stages in sequence:

a first n type epitaxial layer is grown on a n+ type substrate 27 of monocrystalline silicon, with a high concentration of impurities;

using the usual techniques of oxidation, photomasking, implantation and diffusion, p+ type regions 30 and 29 are formed within layer 28, to constitute respectively the gate region of the BMFET and the horizontal isolation region of the components of the integrated control circuit;

an n+ type region 31 is formed within region 29, to constitute the buried collector layer of the transistor of the integrated control circuit, and an n+ type region 32 (intended to be the source of the BMFET) situated between two regions 30, inside which it extends;

a second epitaxial layer is grown, creating the n type region 33, which covers the whole surface of the chip;

using known techniques of oxidation, photomasking and implantation of the second epitaxial layer and successive diffusion, p+ type regions 35 and 34 are made; regions 35 are located immediately above regions 30 and join them, regions 34 extend from the upper surface of the second epitaxial layer down to region 29;

two n+ type regions 36 and 37 are formed; region 36 is located immediately above region 32 and joins it, while region 37 constitutes the collector sinker, is placed above region 31 and joins it;

using well known techniques the base region 38 and the emitter 39 of the NPN low voltage transistor are formed, the contacts are opened and the various elements of the device are interconnected using a process of metallization and photomasking.

According to another possible variation, the epitaxial region 5 in FIG. 6 could be formed by a double growth, or in such a way as to present a variable resistance. Another variation could be a double level of metallization.

This double level of metallization would be particularly advisable for the structure according to the present invention, as it would permit a sensible reduction of space both for the power stage and for the control system. In fact for the metallization paths which collect the gate and source current of the BMFET, space could be saved which could be used to produce other elementary cells. In the same way it is possible to achieve higher component density in the region occupied by the control circuit.

We claim:

1. A semiconductor device, disposed on a substrate of mono-crystalline silicon, and comprising a power stage with vertical current flow and a control circuit, integrated in monolithic form on a single chip, and also including an isolation region to insulate the control circuit from the power stage and to also insulate the components of the control circuit from each other, wherein the power stage consists of at least one BMFET transistor, and wherein the distance between a lower edge of the isolation region and the substrate is substantially the same as the distance between a lower edge of the gate region of the at least one BMFET transistor and the substrate itself.

2. A semiconductor device, disposed on a substrate of monocrystalline silicon, and comprising a power stage with a vertical current flow and a control circuit, integrated in monolithic form on a single chip, and also including an isolation region to insulate the control circuit from the power stage and to also insulate the control circuit from each other, wherein the power stage consists of at least one BMFET transistor, and wherein the distance between a lower edge of the isolation region and the substrate is substantially the same as the distance between a lower edge of the gate region of the at least one BMFET transistor and the substrate itself, and wherein the distance between a lower edge of the source region of the at least one BMFET transistor and the substrate is substantially the same as the distance between a lower margin of the buried collector layers of the transistor of the control circuit and the substrate itself.

* * * * *